United States Patent
Iizuka

(10) Patent No.: US 9,842,786 B2
(45) Date of Patent: Dec. 12, 2017

(54) SEMICONDUCTOR DEVICE

(71) Applicant: FUJI ELECTRIC CO., LTD., Kawasaki-shi, Kanagawa (JP)

(72) Inventor: Yuji Iizuka, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/851,748

(22) Filed: Sep. 11, 2015

(65) Prior Publication Data

US 2016/0005670 A1 Jan. 7, 2016

Related U.S. Application Data

(63) Continuation of application No. PCT/JP2014/003408, filed on Jun. 25, 2014.

(30) Foreign Application Priority Data

Aug. 23, 2013 (JP) .................................. 2013-173487

(51) Int. Cl.
*H01L 23/053* (2006.01)
*H01L 23/40* (2006.01)
(Continued)

(52) U.S. Cl.
CPC ............ *H01L 23/053* (2013.01); *H01L 23/16* (2013.01); *H01L 23/3121* (2013.01);
(Continued)

(58) Field of Classification Search
CPC . H01L 23/053; H01L 23/16; H01L 23/83121; H01L 23/3675; H01L 23/4006;
(Continued)

(56) References Cited

U.S. PATENT DOCUMENTS

2003/0059978 A1 3/2003 Suzuki et al.
2004/0238827 A1* 12/2004 Takayama ........... H01L 27/1214
257/79
(Continued)

FOREIGN PATENT DOCUMENTS

CN    2847525 Y    12/2006
JP    S55-165657 A    12/1980
(Continued)

OTHER PUBLICATIONS

PCT, "International Search Report for International Application No. PCT/JP2014/003408".
(Continued)

*Primary Examiner* — Christine Enad
(74) *Attorney, Agent, or Firm* — Manabu Kanesaka

(57) ABSTRACT

A semiconductor device includes a supporting plate including a first surface, a second surface opposite to the first surface, and a through hole extending from the first surface to the second surface; and a semiconductor unit fixed to the first surface. The semiconductor unit includes an insulating plate, a circuit plate fixed to a front surface of the insulating plate, a semiconductor chip fixed to the circuit plate, and a protruding metal block fixed to a rear surface of the insulating plate and penetrating through the through hole to extend to the second surface.

16 Claims, 4 Drawing Sheets

(51) Int. Cl.
| | |
|---|---|
| *H01L 25/07* | (2006.01) |
| *H01L 25/18* | (2006.01) |
| *H01L 23/16* | (2006.01) |
| *H01L 23/31* | (2006.01) |
| *H01L 23/00* | (2006.01) |
| *H01L 23/367* | (2006.01) |
| *H01L 23/373* | (2006.01) |
| *H01L 23/498* | (2006.01) |

(52) U.S. Cl.
CPC ...... *H01L 23/3675* (2013.01); *H01L 23/4006* (2013.01); *H01L 23/49838* (2013.01); *H01L 24/13* (2013.01); *H01L 25/07* (2013.01); *H01L 25/072* (2013.01); *H01L 25/18* (2013.01); *H01L 23/3735* (2013.01); *H01L 23/49833* (2013.01); *H01L 23/49844* (2013.01); *H01L 24/16* (2013.01); *H01L 2023/4056* (2013.01); *H01L 2023/4062* (2013.01); *H01L 2023/4087* (2013.01); *H01L 2224/13005* (2013.01); *H01L 2224/13016* (2013.01); *H01L 2224/13023* (2013.01); *H01L 2224/16238* (2013.01); *H01L 2224/48* (2013.01); *H01L 2924/1305* (2013.01); *H01L 2924/13055* (2013.01); *H01L 2924/13091* (2013.01)

(58) Field of Classification Search
CPC ......... H01L 23/49838; H01L 23/49844; H01L 24/13; H01L 24/16; H01L 25/07; H01L 25/072; H01L 25/18
See application file for complete search history.

(56) References Cited

U.S. PATENT DOCUMENTS

| | | | | |
|---|---|---|---|---|
| 2007/0018321 | A1* | 1/2007 | Hiatt | H01L 23/3114 257/737 |
| 2011/0096902 | A1* | 4/2011 | Anbe | H05B 3/283 378/58 |
| 2011/0194246 | A1* | 8/2011 | Nakasaka | H05K 7/20927 361/688 |
| 2011/0291258 | A1 | 12/2011 | Murayama et al. | |
| 2012/0133427 | A1* | 5/2012 | Kim | H01L 23/34 327/564 |
| 2012/0313252 | A1* | 12/2012 | Ueda | H01L 23/3121 257/773 |
| 2014/0231981 | A1 | 8/2014 | Kojima et al. | |

FOREIGN PATENT DOCUMENTS

| | | |
|---|---|---|
| JP | S56-7353 U | 1/1981 |
| JP | S57-157550 A | 9/1982 |
| JP | H04-051549 A | 2/1992 |
| JP | H06-196625 A | 7/1994 |
| JP | 2002-313841 A | 10/2002 |
| JP | 2002-329815 A | 11/2002 |
| JP | 2003-243611 A | 8/2003 |
| JP | 2007-194442 A | 8/2007 |
| JP | 2007-243051 A | 9/2007 |
| JP | 2011-142124 A | 7/2011 |
| JP | 2011-249684 A | 12/2011 |
| JP | 2012-054319 A | 3/2012 |
| WO | 2013/121691 A1 | 8/2013 |

OTHER PUBLICATIONS

Japan Patent Office, "Office Action for Japanese Patent Application No. 2015-532684," dated Jun. 14, 2016.
China Patent Office, "Office Action for Chinese Patent Application No. 201480015666.2," dated Mar. 31, 2017.

* cited by examiner

SEMICONDUCTOR DEVICE

CROSS-REFERENCES TO RELATED APPLICATIONS

The present application is a Continuation Application of PCT International Application No. PCT/JP2014/003408 filed Jun. 25, 2014, and claiming priority from Japanese Application No. 2013-173487 filed Aug. 23, 2013, the disclosure of which is incorporated herein.

TECHNICAL FIELD

The present invention relates to a semiconductor device, and more particularly, to a power semiconductor module including a power semiconductor chip.

BACKGROUND ART

A semiconductor device (power semiconductor module) has been used independently of a main device in, for example, an inverter apparatus, an uninterruptible power system, a machine tool, and an industrial robot.

For example, a power semiconductor module disclosed in Patent Document 1 has been known as a power semiconductor module according to the related art. FIG. 4 illustrates the structure of the power semiconductor module according to the related art. The power semiconductor module includes, for example, a heat sink 101, an insulating substrate 103, a semiconductor chip 102, and a resin case 104. The heat sink 101 includes a base 101a with high thermal conductivity and a cooling fin 101b. The insulating substrate 103 having the semiconductor chip 102 mounted thereon is fixed to the base 101a. In addition, the semiconductor chip 102 and the insulating substrate 103 are surrounded by the resin case 104. A bonding wire 105 is bonded to a front electrode of the semiconductor chip 102 and the semiconductor chip 102 is electrically connected to a circuit plate 106 of the insulating substrate 103. In addition, the upper end of the resin case 104 is covered with a lid 107 and an external terminal 108 which passes through the lid 107 and protrudes upward from the lid 107 is provided on the circuit plate 106.

Patent Document 2 discloses a power semiconductor module in which a plurality of semiconductor units and a bolting unit are integrated by an elastic adhesive and the plurality of semiconductor units can be fixed to a heat sink by the bolting unit.

CITATION LIST

Patent Document

Patent Document 1: JP 2007-194442 A
Patent Document 2: JP 2011-142124 A

DISCLOSURE OF THE INVENTION

Problem to be Solved by the Invention

In recent years, there has been an increasing demand for a power conversion apparatus and the characteristics of a semiconductor chip have been improved. It is necessary to prepare power semiconductor modules with various ratings in order to meet the demand.

In the power semiconductor module disclosed in Patent Document 1, it is necessary to prepare the semiconductor chip 102, the insulating substrate 103, the resin case 104, and the lid 107, and the terminal 108 corresponding to each rating.

In addition, manufacturing tools corresponding to each rating are needed; thus, reducing the manufacturing costs is difficult.

In the power semiconductor module disclosed in Patent Document 2, a plurality of semiconductor units with one rating can be combined to prepare power semiconductor modules with various ratings. However, when many semiconductor units with high rating capacity are needed, the central semiconductor unit is arranged so as to be separated from the bolting unit. In addition, since each semiconductor unit and the bolting unit are fixed to each other by the elastic adhesive, contact pressure with the heat sink is less likely to be transmitted to the semiconductor unit which is separated from the bolting unit. Therefore, the cooling efficiency of the semiconductor chip mounted on the semiconductor unit is reduced.

Accordingly, the invention has been made in view of the above-mentioned problems of the related art and an object of the invention is to provide a semiconductor device which has a common basic structure in order to improve production efficiency and can ensure sufficient cooling efficiency.

Means for Solving Problem

In order to achieve the object, according to an aspect of the invention, a semiconductor device includes: a supporting plate including a first surface, a second surface opposite to the first surface, and a through hole which extends from the first surface to the second surface; and a semiconductor unit that includes a semiconductor chip, a connection terminal, and a protruding metal block and is fixed to the first surface. The metal block is inserted into the through hole and reaches the second surface.

Effect of the Invention

According to the invention, it is possible to provide a semiconductor device which has a common basic structure in order to improve production efficiency and can ensure sufficient cooling efficiency.

MODE(S) FOR CARRYING OUT THE INVENTION

Hereinafter, an embodiment of the invention will be described with reference to FIGS. 1 to 3. The term "electrically and mechanically connected" used in the application is not limited to a case in which objects are connected to each other by direct bonding and includes a case in which objects are connected to each other through a conductive bonding material such as solder or a sintered metal material.

Figure 1:
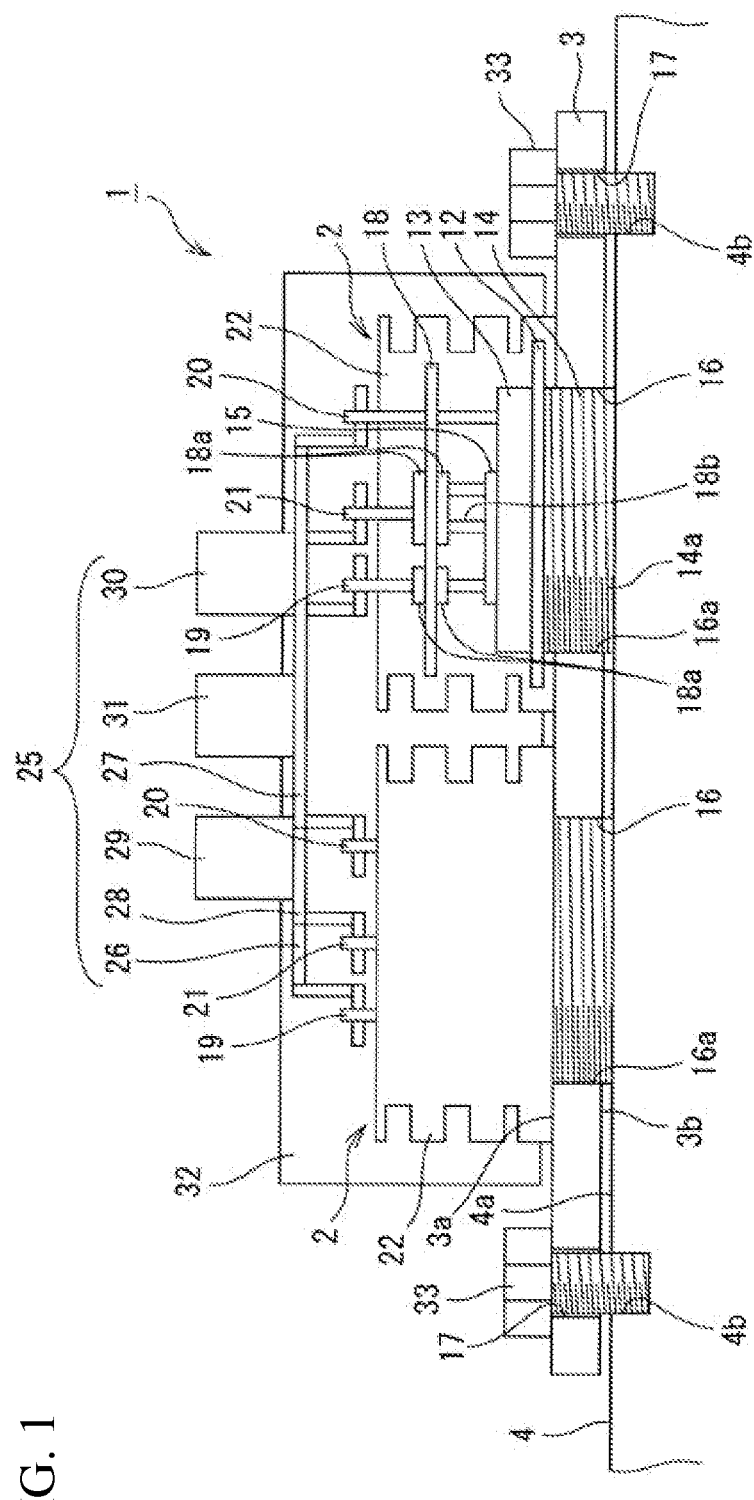
FIG. 1 is a cross-sectional view illustrating a semiconductor device according to a first embodiment of the invention.
Figure 2:
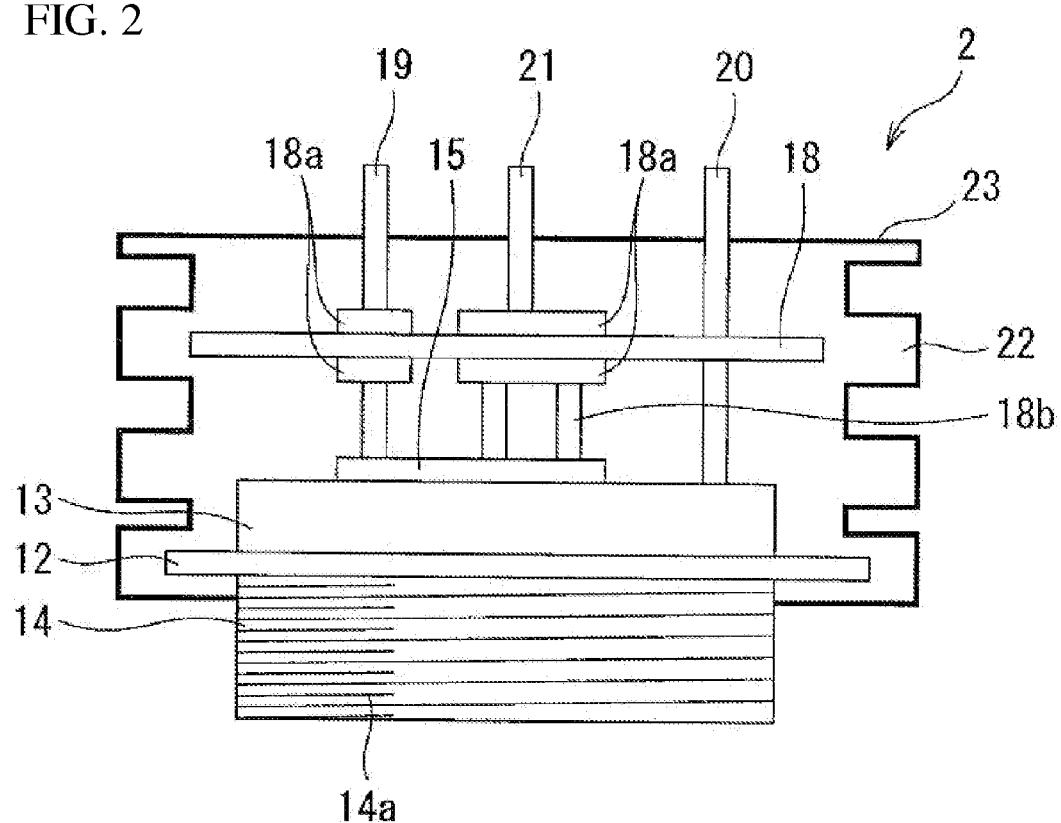
FIG. 2 is an enlarged cross-sectional view illustrating a semiconductor unit illustrated in FIG. 1.

FIG. 1 is a cross-sectional view illustrating the overall structure of a first embodiment of a semiconductor device according to the invention and FIG. 2 is an enlarged cross-sectional view illustrating a semiconductor unit illustrated in FIG. 1.

A power semiconductor module 1 as the semiconductor device according to the invention includes a semiconductor unit 2 and a supporting plate 3. The supporting plate 3 is fixed to a heat sink 4.

As illustrated in FIG. 2, the semiconductor unit 2 includes a semiconductor chip 15 and a metal block 14. In addition, the semiconductor unit 2 includes, for example, a circuit plate 13, an insulating plate 12, connection terminals 19, 20, and 21, and a sealing resin 22. The semiconductor chip 15 is a power semiconductor element, such as an insulated gate bipolar transistor (IGBT), a power MOSFET, or a freewheeling diode (FWD).

The metal block 14 has a cylindrical shape and protrudes outward from the sealing resin 22. The protruding portion is thicker than the supporting plate 3. A male screw portion 14a is provided in an outer circumferential surface of the protruding portion. The male screw portion 14a can be formed by precision machining.

The supporting plate 3 includes a first surface 3a, a second surface 3b opposite to the first surface 3a, and through holes 16 which extend from the first surface 3a to the second surface 3b. A female screw portion 16a corresponding to the male screw portion 14a is provided in an inner circumferential surface of the through hole 16. The female screw portion 16a can be formed by precision machining. In addition, attachment holes 17 are provided at the outer edge of the supporting plate 3. The supporting plate 3 is made of a single material, such as Cu or Al with high thermal conductivity or W or Mo with a low linear expansion coefficient. Alternatively, the supporting plate 3 is made of a composite material such as Cu—C, Al—C, Al—SiC, Cu—Mo, Cu, Cu—W, or Si—SiC which has high thermal conductivity and a low linear expansion coefficient.

A wiring substrate 18 including a metal layer 18a is provided so as to face the circuit plate 13. One end of a conductive post 18b is electrically and mechanically connected to the metal layer 18a of the wiring substrate 18. The other end of the conductive post 18b is electrically and mechanically connected to a front electrode of the semiconductor chip 15 or the circuit plate 13. That is, the internal wiring of the semiconductor unit 2 is not performed by bonding wires according to the related art, but is performed by the wiring substrate 18 and the conductive post 18b. In addition, the connection terminals 19, 20, and 21 are electrically and mechanically connected to the circuit plate 13 or the metal layer 18a of the wiring substrate 18.

The insulating plate 12, the circuit plate 13, the semiconductor chip 15, and the wiring substrate 18 are covered with the sealing resin 22 which is a thermosetting resin such as an epoxy resin. An uneven portion for increasing a creeping distance is provided in the side surface of the sealing resin 22. It is preferable that a protective film 23 which is made of an inorganic material, such as $Al_2O_3$, AlN, $Si_3N_4$, $SiO_2$, or BN, be provided on the surface of the sealing resin 22, as illustrated in FIG. 2. The metal block 14 and the connection terminals 19 to 21 protrude outward from the sealing resin 22.

The male screw portion 14a of the metal block 14 is screwed with the female screw portion 16a of the supporting plate 3 from the first surface 3a to mount two semiconductor units 2 having the above-mentioned structure on the supporting plate 3. Then, the bottom of the sealing resin 22 contacts the upper surface of the supporting plate 3 and is fixed to the supporting plate 3. At that time, the end surface of the metal block 14 protrudes from the second surface 3b of the supporting plate 3 by a predetermined distance.

In addition, the semiconductor device includes an external terminal 25 which electrically connects the connection terminals 19 to 21 protruding from the two semiconductor units 2 to form a desired circuit. The external terminal 25 includes, for example, bus bars 26, 27 and 28 having a flat plate shape and terminal portions 29, 30, and 31 which are connected to the bus bars.

The semiconductor unit 2 or the external terminal 25 is covered with a housing 32 which is made of, for example, an insulating resin, and the terminal portions 29 to 31 protrude outward from the housing 32. In this way, the semiconductor device 1 which is a two-in-one power semiconductor module according to an aspect of the invention is formed.

When the semiconductor device 1 having the above-mentioned structure is used, the semiconductor device 1 is fixed to a fixing surface 4a of the heat sink 4. The position of the attachment hole 17 of the supporting plate 3 is aligned with the position of the female screw portion 4b of the heat sink 4 and a locking screw 33 is inserted into the attachment hole 17 and is screwed with the female screw portion 4b. At that time, since the end surfaces of the metal blocks 14 of the two semiconductor units 2 protrude to the same height from the second surface 3b of the supporting plate 3, the metal blocks 14 directly contact the fixing surface 4a.

As such, according to the above-described embodiment, the semiconductor unit 2 including the semiconductor chip 15 and the protruding metal block 14 is fixed to the supporting plate 3 and the supporting plate 3 is fixed to the heat sink 4 by the locking screws 33. Therefore, a plurality of semiconductor units 2 with one rating can be combined by the supporting plate 3 and it is possible to prepare power semiconductor modules with various ratings. In addition, the metal block 14 of the semiconductor unit 2 directly contacts the heat sink 4. Therefore, heat generated from the semiconductor chip 15 can be directly transmitted to the heat sink 4 through the metal block 14 and it is possible to improve cooling efficiency.

Since a plurality of semiconductor units 2 is fixed to the supporting plate 3 by screwing, it is possible to accurately adjust the amount of protrusion from the second surface 3b. Therefore, it is possible to maintain a good contact between the fixing surface 4a of the heat sink 4 and the metal block 14 of each semiconductor unit 2. In addition, the semiconductor unit 2 can pressure contact the heat sink 4 through the supporting plate 3, without using an elastic adhesive, unlike Patent Document 2. Therefore, it is possible to ensure sufficient cooling efficiency even in the central semiconductor unit.

Since the semiconductor unit 2 can be fixed to the supporting plate 3 only by screwing, it is possible to reduce manufacturing costs.

When the insulating substrate 103 having the semiconductor chip 102 mounted thereon is directly bonded to the base 101a of the heat sink 101 by solder as in the above-mentioned related art, a positioning tool is needed. In addition, solder needs to be interposed between the radiator plate and the base 101a and it is difficult to directly contact a radiator plate to the base 101a. When a plurality of insulating substrates 103 is bonded to the base 101a, it is difficult to perform the bonding while ensuring flatness. In contrast, in this embodiment, as described above, the metal block 14 of the semiconductor unit 2 is screwed to the supporting plate 3. Therefore, it is possible to accurately adjust the amount of protrusion of the metal block 14 from the supporting plate 3 using high precision machining and to accurately ensure the flatness of the end surfaces of the metal blocks 14 in a plurality of semiconductor units 2.

Figure 3:
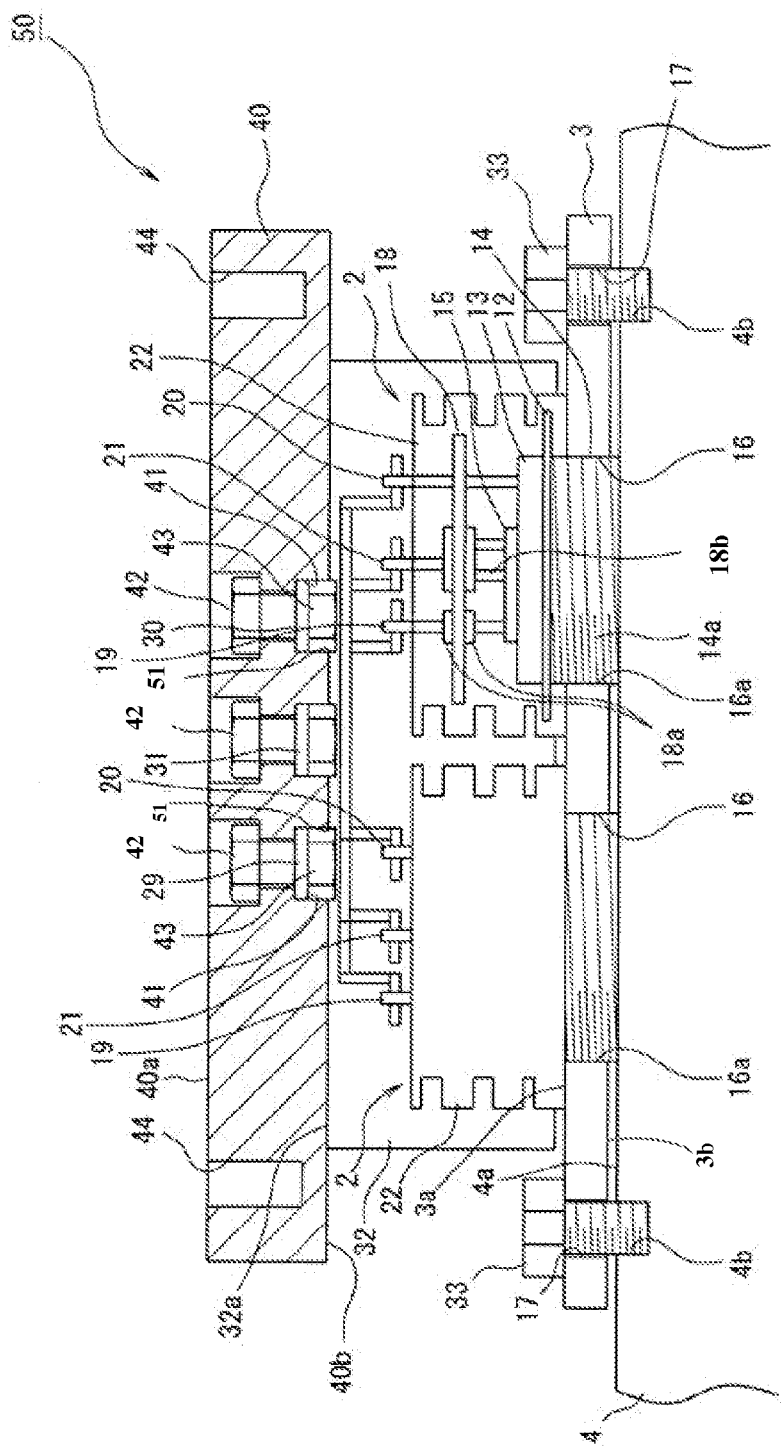
FIG. 3 is a cross-sectional view illustrating a semiconductor device according to a second embodiment of the invention.
Figure 4:
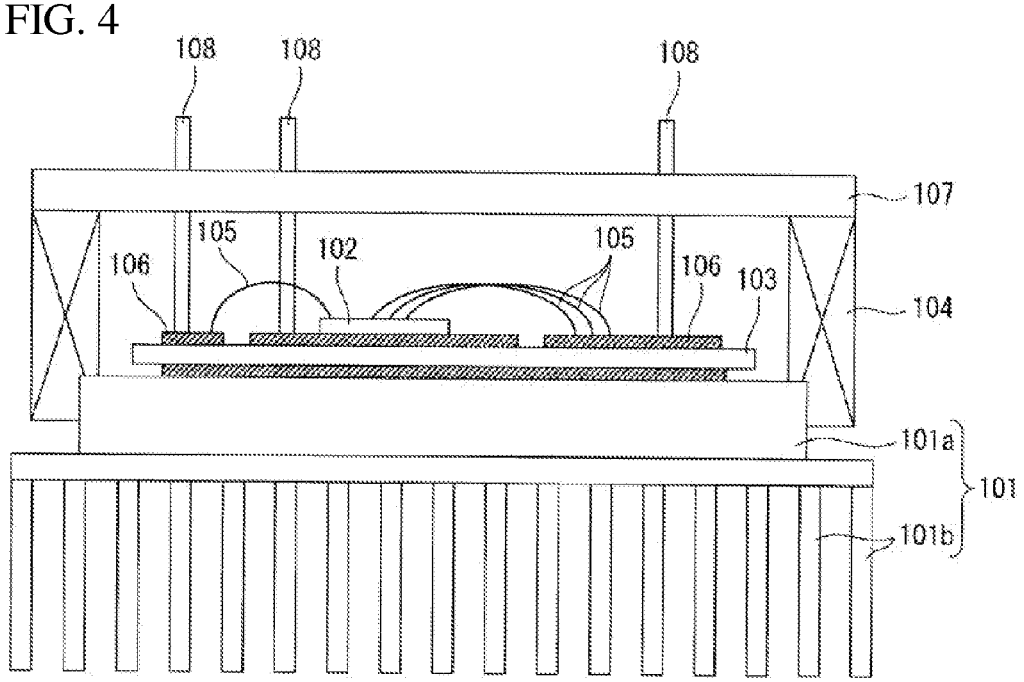
FIG. 4 is a cross-sectional view illustrating the related art.

FIG. 3 is a cross-sectional view illustrating the overall structure of a second embodiment of the semiconductor device according to the invention. In FIG. 3, the same members as those in the semiconductor device 1 illustrated in FIG. 1 are denoted by the same reference numerals and the description thereof will not be repeated.

A power semiconductor module 50 which is an aspect of the semiconductor device according to the invention further includes a heat transmission plate 40 and a bolt 42, as compared to the first embodiment.

The heat transmission plate 40 has a first surface 40*a* and a second surface 40*b* opposite to the first surface 40*a*. The second surface 40*b* of the heat transmission plate 40 is fixed to a terminal surface 32*a* of a housing 32 by, for example, an adhesive. In addition, terminal portions 29 to 31 of an external terminal 25 which protrudes from the terminal surface 32*a* of the housing 32 are inserted into terminal holes 41 provided in the second surface 40*b* of the heat transmission plate 40 while being bent in an L-shape. The terminal portions 29 to 31 are fixed by bolts 42 which are inserted from the first surface 40*a* and nuts 43 which are inserted from a second main surface. In this case, it is preferable to form a concave portion 51, to which the nut 43 is fitted and which stops the rotation of the nut 43, in the terminal surface 32*a* of the housing 32.

As such, in the semiconductor device 50, it is possible to improve heat dissipation characteristics from the terminal surface 32*a* of the housing 32. In addition, a fastening hole 44 which is provided in the first surface 40*a* of the heat transmission plate 40 can be used to fix an external device to the semiconductor device 50. This is because the heat transmission plate 40 is firmly fixed to the housing 32 by two means, that is, the adhesive and the terminal portions 29 to 31 which are fixed by the bolts 42 and the nuts 43.

In the above-described embodiments, the metal block 14 of the semiconductor unit 2 protrudes from the second surface 3*b* of the supporting plate 3. However, the invention is not limited thereto. For example, the end surface of the metal block 14 may be flush with the second surface 3*b* of the supporting plate 3.

In the above-described embodiments, the semiconductor chip 15 is electrically connected to the connection terminals 19 to 21 by the conductive posts 18*b* and the wiring substrate 18. However, the invention is not limited to this structure. For example, the electrical connection may be performed by a bonding wire as in the related art as long as the protruding metal block 14 is provided.

In the above-described embodiments, the semiconductor unit 2 is an insulated semiconductor unit including the insulating plate 12. However, the invention is not limited thereto. For example, the semiconductor unit 2 may be a non-insulated semiconductor unit without the insulating plate 12. In this case, the semiconductor unit 2 can be fixed to the supporting plate 3 by the same method as described above.

In the above-described embodiments, two semiconductor units 2 are fixed to the supporting plate 3. However, the invention is not limited thereto. For example, the through holes 16 having the female screw portions 16*a* may be formed in the supporting plate 3 according to the number of semiconductor units required for a desired rating.

In the above-described embodiments, the semiconductor unit 2 includes one semiconductor chip 15. However, the invention is not limited thereto. Two or more semiconductor chips may be fixed to the circuit plate 13.

In the above-described embodiments, the supporting plate 3 is fixed to the heat sink 4 by the locking screws 33. However, the invention is not limited thereto. Male screw portions which are fixed to the heat sink 4 may be inserted into the supporting plate 3 so as to protrude from the first surface 3*a* and nuts may be screwed with the male screw portions. That is, the metal block supported by the supporting plate 3 may be fixed while contacting the heat sink 4 or an arbitrary fixing means may be applied.

The semiconductor device according to the invention has been described in detail using the drawings and the embodiments. However, the semiconductor device according to the invention is not limited to that described in the embodiments and the drawings and various modifications and changes of the invention can be made without departing from the scope and spirit of the invention.

EXPLANATIONS OF LETTERS OR NUMERALS

1, 50 SEMICONDUCTOR DEVICE
2 SEMICONDUCTOR UNIT
3 SUPPORTING PLATE
3*a* FIRST SURFACE
3*b* SECOND SURFACE
4 HEAT SINK
12 INSULATING PLATE
13 CIRCUIT PLATE
14 METAL BLOCK
14*a* MALE SCREW PORTION
15 SEMICONDUCTOR CHIP
16 THROUGH HOLE
16*a* FEMALE SCREW PORTION
17 ATTACHMENT HOLE
18 WIRING SUBSTRATE
19 TO 21 CONNECTION TERMINAL
22 SEALING RESIN
23 PROTECTIVE FILM
25 EXTERNAL TERMINAL
29 TO 31 TERMINAL PORTION
32 HOUSING
40 HEAT TRANSMISSION PLATE
42 BOLT
43 NUT

What is claimed is:

1. A semiconductor device comprising:
a supporting plate including a first surface, a second surface opposite to the first surface, and a through hole extending from the first surface to the second surface; and
a semiconductor unit fixed to the first surface, the semiconductor unit including
an insulating plate,
a circuit plate fixed to a front surface of the insulating plate,
a semiconductor chip fixed to the circuit plate, and a protruding metal block fixed to a rear surface of the insulating plate, the protruding metal block penetrating through the through hole and protruding from the second surface,
wherein the insulating plate, the circuit plate, the semiconductor chip, and the protruding metal block are integrally coupled to form the semiconductor unit as one member.

2. The semiconductor device according to claim 1, wherein the semiconductor unit further comprises a sealing resin covering the semiconductor chip.

3. The semiconductor device according to claim 1, wherein the supporting plate is made of any one of Cu, Al, Mo, W, Cu—C, Al—C, Al—SiC, Cu—Mo, or Si—SiC.

4. The semiconductor device according to claim 1, wherein the semiconductor unit further comprises an uneven portion provided on a side surface.

5. The semiconductor device according to claim 1, wherein the semiconductor unit further comprises a protective film made of any one of $Al_2O_3$, AlN, $Si_3N_4$, $SiO_2$, or BN on a surface thereof.

6. The semiconductor device according to claim 1, further comprising a heat sink arranged apart from the supporting plate and contacted to the protruding metal block,
wherein the protruding metal block transmits heat generated from the semiconductor unit to the heat sink.

7. A semiconductor device comprising:
a supporting plate including a first surface, a second surface opposite to the first surface, and a through hole extending from the first surface to the second surface; and
a semiconductor unit fixed to the first surface, the semiconductor unit including
an insulating plate,
a circuit plate fixed to a front surface of the insulating plate,
a semiconductor chip fixed to the circuit plate, and
a protruding metal block fixed to a rear surface of the insulating plate and penetrating through the through hole to extend to the second surface,
wherein the metal block includes a male screw portion,
the through hole includes a female screw portion, and
the male screw portion and the female screw portion are screwed to each other to fix the semiconductor unit to the first surface of the supporting plate.

8. A semiconductor device comprising:
a supporting plate including a first surface, a second surface opposite to the first surface, and a plurality of through holes extending from the first surface to the second surface;
a plurality of semiconductor units fixed to the first surface and the plurality of through holes, and each including a semiconductor chip, a protruding metal block connected to the semiconductor chip, and a connection terminal, the protruding metal block penetrating through the through hole and protruding from the second surface;
external terminals connected to the respective connection terminals of the plurality of semiconductor units, and
a heat sink arranged apart from the supporting plate and contacted to the protruding metal blocks,
wherein the protruding metal blocks transmit heat generated from each of the plurality of semiconductor units to the heat sink.

9. The semiconductor device according to claim 8, further comprising:
a housing covering the plurality of semiconductor units and the external terminals; and
a heat transmission plate fixed to the housing.

10. The semiconductor device according to claim 9, wherein the heat transmission plate has terminal holes to receive the external terminals.

11. The semiconductor device according to claim 8, wherein each of the plurality of semiconductor units further comprises a sealing resin covering the semiconductor chip.

12. The semiconductor device according to claim 8, wherein the supporting plate is made of any one of Cu, Al, Mo, W, Cu—C, Al—C, Al—SiC, Cu—Mo, or Si—SiC.

13. The semiconductor device according to claim 8, wherein each of the plurality of semiconductor units further comprises an uneven portion provided on a side surface thereof.

14. The semiconductor device according to claim 8, wherein each of the plurality of semiconductor units further comprises a protective film made of any one of $Al_2O_3$, AlN, $Si_3N_4$, $SiO_2$, or BN on a surface thereof.

15. The semiconductor device according to claim 8, wherein each of the plurality of semiconductor units further includes an insulating plate and a circuit plate fixed to a front surface of the insulating plate such that the semiconductor chip is fixed to the circuit plate, the protruding metal block is fixed to a rear surface of the insulating plate, and the connection terminal extends from the semiconductor chip or the circuit plate, and
wherein the insulating plate, the circuit plate, the semiconductor chip, the protruding metal block, and the connection terminal in each of the plurality of semiconductor units are integrally coupled as one member.

16. A semiconductor device comprising:
a supporting plate including a first surface, a second surface opposite to the first surface, and a plurality of through holes extending from the first surface to the second surface;
a plurality of semiconductor units fixed to the first surface and the plurality of through holes, and each including a semiconductor chip, a protruding metal block penetrating through the through hole to extend to the second surface, and a connection terminal; and
external terminals connected to the respective connection terminals of the plurality of semiconductor units,
wherein the metal block includes a male screw portion,
each of the plurality of through holes includes a female screw portion, and
the male screw portion and the female screw portion are screwed to each other to fix each of the plurality of semiconductor units to the first surface of the supporting plate.

* * * * *